(12) United States Patent
Hettler et al.

(10) Patent No.: US 9,159,634 B2
(45) Date of Patent: Oct. 13, 2015

(54) TRANSISTOR OUTLINE HOUSING AND METHOD FOR PRODUCING SAME

(71) Applicant: Schott AG, Mainz (DE)

(72) Inventors: Robert Hettler, Kumhausen (DE);
Kenneth Tan, Singapore (SG); Georg Mittermeier, Altfraunhofen (DE);
Karsten Droegemueller, Eichenau (DE)

(73) Assignee: SCHOTT AG, Mainz (DE)

( * ) Notice: Subject to any disclaimer, the term of this patent is extended or adjusted under 35 U.S.C. 154(b) by 0 days.

(21) Appl. No.: 14/158,690

(22) Filed: Jan. 17, 2014

(65) Prior Publication Data

US 2014/0217570 A1     Aug. 7, 2014

(30) Foreign Application Priority Data

Jan. 18, 2013 (DE) .......................... 10 2013 100 510

(51) Int. Cl.
| | | |
|---|---|---|
| *H01L 23/48* | (2006.01) | |
| *H01L 29/32* | (2006.01) | |
| *H01L 23/08* | (2006.01) | |
| *H01L 23/66* | (2006.01) | |
| *H01L 23/64* | (2006.01) | |
| *H01L 23/045* | (2006.01) | |
| *H01L 23/31* | (2006.01) | |

(52) U.S. Cl.
CPC .............. *H01L 23/08* (2013.01); *H01L 23/045* (2013.01); *H01L 23/64* (2013.01); *H01L 23/66* (2013.01); *H01L 23/3157* (2013.01); *H01L 2223/6622* (2013.01); *H01L 2224/04042* (2013.01); *H01L 2224/05554* (2013.01); *H01L 2224/32225* (2013.01); *H01L 2224/32245* (2013.01); *H01L 2224/48091* (2013.01); *H01L 2224/48137* (2013.01); *H01L 2224/49171* (2013.01); *H01L 2224/85203* (2013.01); *H01L 2224/85205* (2013.01); *H01L 2224/85207* (2013.01)

(58) Field of Classification Search
CPC ......... H01L 23/10; H01L 23/66; H01L 23/08; H01L 2223/6611
USPC .............. 257/81, 99, 690, 692, 693, 698, 699
See application file for complete search history.

(56) References Cited

U.S. PATENT DOCUMENTS

| | | | |
|---|---|---|---|
| 4,951,011 A | 8/1990 | Heckaman et al. | |
| 6,074,102 A | 6/2000 | Oikawa | |
| 7,868,332 B2 * | 1/2011 | Rho et al. ......................... 257/79 |

(Continued)

FOREIGN PATENT DOCUMENTS

| | | |
|---|---|---|
| DE | 10221706 A1 | 11/2003 |
| JP | H0287559 A | 3/1990 |

(Continued)

OTHER PUBLICATIONS

German Office Action dated Aug. 27, 2013 corresponding to German Patent Application 10 2013 100 510.1 with English translation.
Japanese Office Action dated Nov. 4, 2014 corresponding to Japanese Patent Application No. 2014-006611 with English translation.

*Primary Examiner* — Hung Vu
(74) *Attorney, Agent, or Firm* — Ohlant, Greeley, Ruggiero & Perle, LLP

(57) ABSTRACT

A transistor outline housing is provided that has bonding wires on an upper surface. The bonding wires are reduced in length and have connection leads with an excess length at an end opposite the bonding end.

11 Claims, 13 Drawing Sheets

(56) References Cited

U.S. PATENT DOCUMENTS

| | | |
|---|---|---|
| 8,053,803 B2 | 11/2011 | Kimura |
| 2005/0194601 A1* | 9/2005 | Suenaga .......................... 257/81 |
| 2006/0192221 A1 | 8/2006 | Zhou et al. |
| 2008/0118251 A1 | 5/2008 | Itamoto |

FOREIGN PATENT DOCUMENTS

| | | |
|---|---|---|
| JP | 2007227724 A | 9/2007 |
| JP | 2008130834 A | 6/2008 |

* cited by examiner

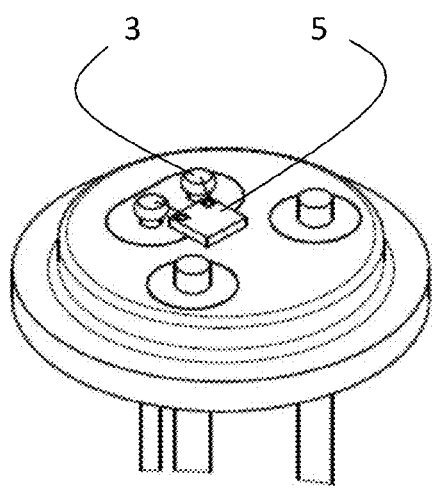
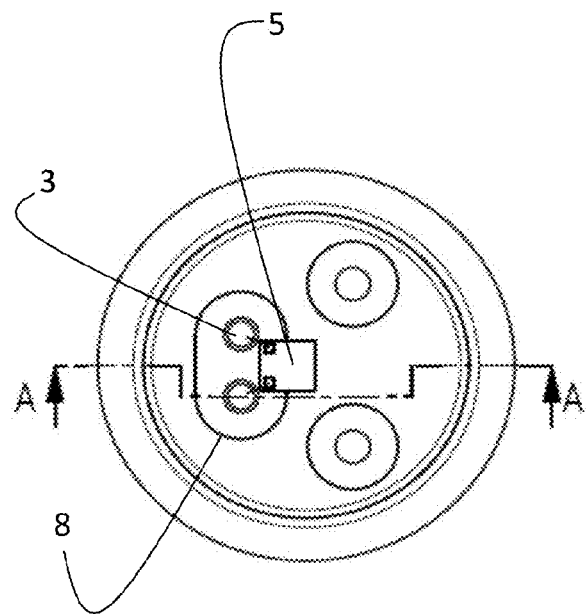
Fig. 17
Fig. 18
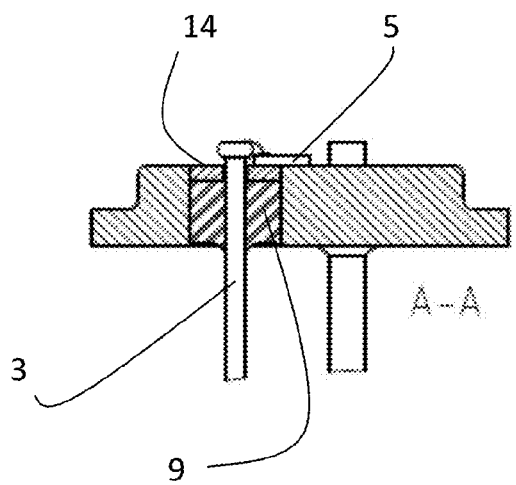
Fig. 19

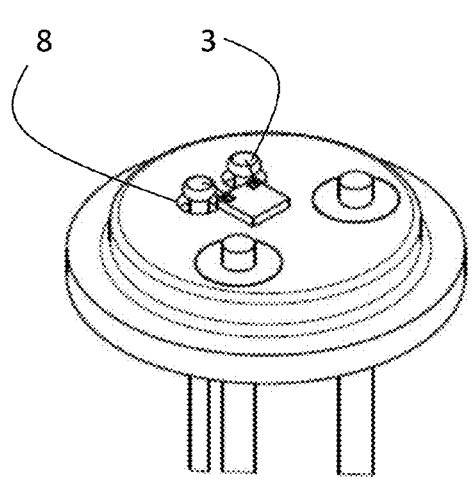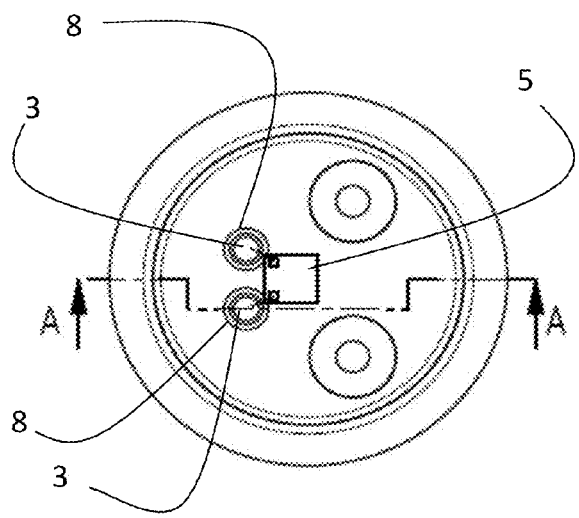
Fig. 20        Fig. 21
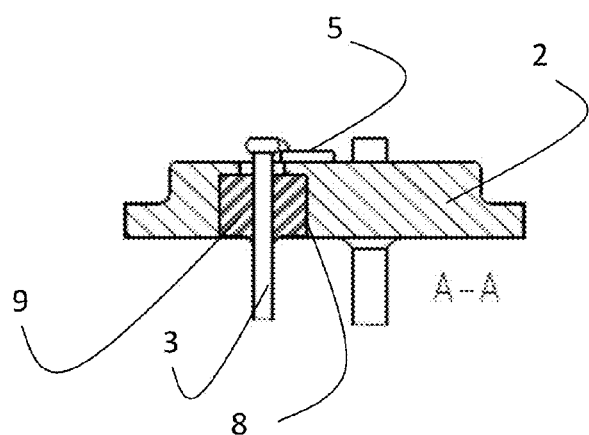
Fig. 22

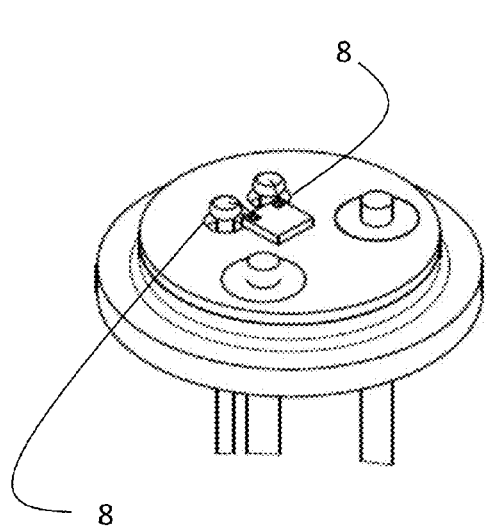
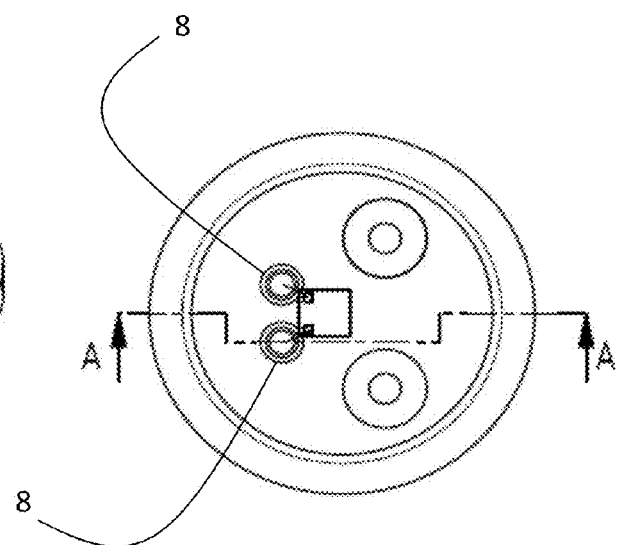
Fig. 23          Fig. 24
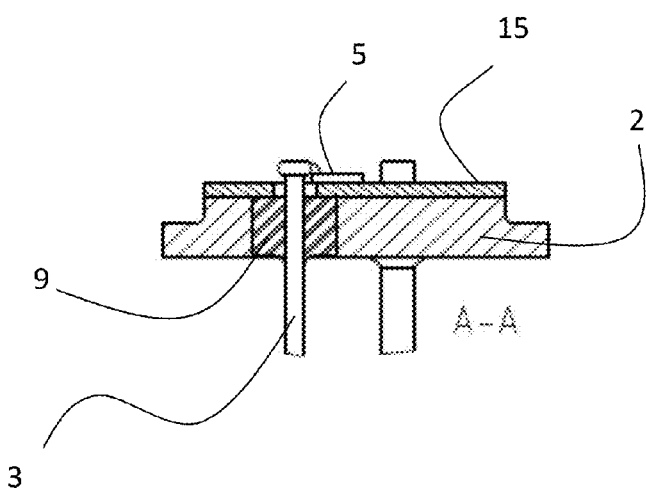
Fig. 25

TRANSISTOR OUTLINE HOUSING AND METHOD FOR PRODUCING SAME

CROSS REFERENCE TO RELATED APPLICATIONS

This application claims benefit under 35 U.S.C. §119(a) of German Patent Application No. 10 2013 100 510.1, filed Jan. 18, 2013, the entire contents of which are incorporated herein by reference.

BACKGROUND OF THE INVENTION

1. Field of the Invention

The invention relates to a transistor outline (TO) housing for high frequency applications, and to a method for producing such a housing.

2. Description of Related Art

TO housings for high frequency applications are known.

In particular document DE 102 21 706 B4 describes a TO housing for high frequency applications.

Such a housing comprises a base which is typically formed as a punched metal part.

The base serves to accommodate a chip with photodiode or a laser diode which is used as a transmitter diode or receiver diode in high frequency applications.

Besides the transmitter diode or receiver diode, other electronic components are typically arranged on the TO housing, in particular an amplifier unit.

The chip is connected via signal leads which are passed through the base.

These signal or connection leads are embedded in a sealing compound, usually of glass, whereby they are insulated from the base and mechanically fixed therein.

Moreover, the glass sealing compound hermetically seals the housing.

With the demand for ever increasing transmission performance, the possible bandwidth of a module comprising such a TO housing has to be increased.

Conventional modules comprising a generic TO housing are presently able to transmit data rates of a maximum of 10 Gbit/s.

In future, however, data rates of more than 20 Gbit/s, in particular data rates from 25 to 28 Gbit/s are desirable.

For achieving this, the impedance of signal carrying elements of such a module is crucial, among other things.

The modules used typically exhibit an electrical impedance, simply referred to as impedance in practice, of about 50 Ω.

It will be understood that the impedance is a function of frequency, and that impedance in the context of the invention refers to the impedance in the high frequency range in which the respective devices are typically operated.

In the high frequency range, a change in impedance involves signal loss due to a reflection. It is therefore desirable that the impedance of the signal path of the transmitter or receiver module is matched with the impedance of the module connected therewith.

In particular it is desired that the transmission and reflection losses are kept as low as possible in a range from 0 to 30 GHz.

Problematic in this context are the bonding wires between the connection leads of the TO housing and the chip on which a transmitter or receiver diode is disposed. A long bonding wire will produce an inductance which reduces the bandwidth of the module comprising the TO housing.

Also problematic are the passages sealed with glass. Due to the comparatively high dielectric constant of glass and the relatively narrow passage, a capacitive characteristic will result which also produces signal loss.

SUMMARY

An object of the invention is to provide a TO housing of conventional design comprising a metal base, which is suitable for use in the high frequency range with increased bandwidth.

In particular data rates of well over 10 Gbit/s should be possible.

The invention relates to a TO housing for high frequency applications, which comprises a base for receiving a device including a receiver diode or transmitter diode.

The module in particular comprises semiconductor devices, so-called chips, with a photo diode and/or a laser diode, the chip comprising further electronic devices, in particular an amplifier unit.

The base is preferably a metal component, in particular with a substantially circular cylindrical or rectangular shape.

The receiver diode and/or transmitter diode may be used to transfer data. This is known in the art and needs no further explanation.

The device comprising the transmitter or receiver diode or an amplifier unit connected to the device, is connected to connection leads by means of bonding wires. The connection leads serve to transfer data using high frequency technology.

Typically, the device is placed on the base and is then contacted, i.e. connected to the connection leads, by means of at least two bonding wires.

For this purpose, different process variations are known to those skilled in the art, in particular thermo-compression bonding, thermosonic ball-wedge bonding, ultrasonic wedge-wedge bonding.

The device in the sense of the invention may also be formed as a module which for example comprises a chip including an amplifier unit, and a transmitter or receiver diode connected thereto, in particular in form of an SMD device.

The connection leads extend through the base, in a passage, and are insulated from the base and secured in the base by means of a sealing compound.

In particular a glass sealing compound is used. Preferably, a glass having a very low dielectric constant is employed, in particular borosilicate glasses.

In particular, each transmitter or receiver diode has associated therewith two connection leads for data transmission.

The connection leads generally extend substantially perpendicular to the upper and lower surface of the base, i.e. they extend in parallel to the main extension direction of a passage through which the connection leads pass.

In one embodiment of the invention, two connection leads are arranged side by side in one passage. This is in case of a differential or balanced type of transmission.

Other embodiments of the invention provide one passage for one connection lead, and a return path via the base.

A central idea of the invention relates to a reduction of the length of the bonding wires, wherein the length of the bonding wire in the context of the invention refers to the distance along which the bonding wire extends from one contact point to the other contact point.

According to the invention, a number of measures are conceivable for reducing the length of the bonding wires.

First, it is conceivable that at least one connection lead has an increased cross section on the side of the device including the transmitter diode or receiver diode as compared to the cross section within the passage.

In particular, for this purpose, the connection lead may have a plate-like or mushroom-shaped portion.

Due to the cross-sectional enlargement, the connection lead is thickened adjacent to the module, so that the contact point for the bonding wire is closer to the contact point of the module.

Another possibility is to asymmetrically arrange the connection lead in the passage.

On the one hand it is conceivable to not arrange the lead in the center of the passage but offset toward the module.

Furthermore it is conceivable that the connection lead is not arranged coaxially in the passage, but obliquely to thereby point toward the contact points of the module.

Another possibility is an angled configuration wherein the angled portions of the connection lead point in the direction of the module.

Moreover, the length of the bonding wires may be reduced by arranging the device that includes the receiver diode or transmitter diode, i.e. in particular the chip, in a manner so as to protrude into the area of the passage.

That is, as seen in a plan view, the chip will at least partially overlap the passage and will get closer to the contact points of the connection lead.

However, it has been found now that the structural changes for reducing the length of the bonding wires described above may lead to an increase in capacitance of the connection lead in the area of the passage over the entire length or part of the length thereof.

As is known, impedance Z in the high frequency range is defined as the square root of the ratio of inductance L to capacitance C.

Now, if the capacity increases in the area of the passage, impedance decreases resulting in higher losses due to signal reflection in high-frequency transmission links.

The inventors have found that the increase in capacity described above may be compensated for at least partially by having at least one connection lead protruding beyond the area of the passage in the base with the sealing compound.

However, the connection lead does not protrude by more than a quarter of the wavelength of the highest frequency spectrum.

The protruding portion or excess length is preferably a portion of the connection lead in which the connection lead extends exposed, i.e. enclosed by air, between a circuit board to which the connection lead is connected and the passage in which the connection lead is enclosed by a sealing compound. That means, connection of the connection lead is established at a point spaced from the sealing compound. However, it is also conceivable that in the region of the excess length the connection lead is enclosed by a material that has a lower dielectric constant than the sealing compound.

The invention may also be described in terms of circuitry.

Since the considered lengths of the leads are typically shorter than a quarter of the wavelength of the highest frequency of the useful spectrum, the leads may be calculated as concentrated devices.

The bonding wire which connects the chip with the connection lead has an inductance $L_b$ associated therewith.

The connection lead arranged in the passage defines a capacitance $C_d$, due to the high dielectric constant of the glass sealing compound.

The invention suggests that an additional inductance $L_ü$ is produced by an excess length at the lower surface of the TO housing, in which the connection lead is enclosed by air.

In terms of circuitry, an $L_b$-$C_d$-$L_ü$ circuit is defined in this way, in the sense of an equivalent circuit of the conductive elements described above.

By suitably dimensioning in particular the excess length, the impedance of the signal path may be adjusted so that the impedance is matched to that of the conductive path on the circuit board so as to minimize reflections.

The amount of inductance $L_ü$ is adjusted through the space between circuit board and base.

In order to exactly maintain this space, one embodiment provides spacers attached to the lower surface of the TO housing, which spacer are particularly formed as pedestal-shaped elevations which ensure a predefined distance to the circuit board.

In this manner, an impedance in the high frequency range may be adjusted between 30 and 80Ω, preferably between 40 and 60Ω.

Preferably, inductance $L_b$ ranges from 80 pH to 300 pH, $C_d$ from 0.065 pF to 0.024 pF, and/or $L_ü$ from 80 pH to 300 pH.

The amount of the excess length may for example be determined as follows:

Depending on the length of the bonding wire, first the inductance of the bonding wire considered as a concentrated device is determined. With a bonding wire length from 80 to 300 μm, inductance will be between 80 and 300 pH, for example.

Then, the amount of excess length may be determined or estimated using the Smith chart, based on a high frequency of 20 GHz, for example.

It is taken into account here that the connection lead embedded in the sealing compound does not has the ideal impedance of typically 50Ω, due to the dielectric constant of the sealing compound. This results in a shift of the impedance point from the inductive half into the capacitive half of the Smith chart.

The excess length below the passage, when similarly considered as a concentrated device, defines an impedance which can be calculated in known manner by those skilled in the art. Further, the difference in impedance between passage and excess length results in an impedance jump to the left in the Smith chart.

Based on the Smith chart, the excess length may now be dimensioned in a manner so that the normalized impedance at the connection point approximately falls to the real axis of the Smith chart, i.e. so that the impedance point will be shifted upwards in the capacitive half of the Smith chart.

The generic TO housings can be connected using a circuit board, in particular a rigid, rigid-flex, and/or a multi-layer circuit board.

The TO-housing equipped with a transmitter diode or receiver diode preferably has an impedance between 30 and 120Ω.

Preferably, the connection lead protrudes from the passage filled with sealing compound by 0.1 to 3 mm, and preferably by 0.15 to 1 mm.

In one modification of the invention, at least one connection lead has an enlarged cross section on the side of the electrical connection as compared to that in the passage.

That means, the connection lead inside the passage is smaller in order to set a desired impedance.

To improve transmission performance, it is furthermore conceivable to form the connection lead with an angular, in particular rectangular cross section, at least in sections thereof.

In one embodiment of the invention, the passage tapers in cross section toward the side of the transmitter or receiver diode, in particular in conical or stepped manner.

Due to a tapering passage, the cross section of the passage will be smaller in the region where the connection lead enters into the housing, so that the device may be placed closer to the connection lead without other design measures.

Alternatively or in combination therewith it is conceivable to attach an additional supporting base, in particular a metal base, next to the connection lead, onto which base the device is placed.

Furthermore, it is conceivable to provide the housing with an intermediate plate that has an opening in the area of the passage through which the connection lead protrudes into the housing, the opening having a smaller diameter than the passage.

The device may now be disposed on the intermediate plate at a closer distance to the connection lead.

The bonding wires preferably have a length of less than 1 mm, more preferably of less than 0.5 mm, and most preferably of less than 0.25 mm.

The TO housing according to the invention and equipped with a transmitter diode or receiver diode may be used for transmitting data at a data rate of more than 20 Gbit/s.

The invention further relates to a method for producing a TO housing, in particular a TO housing as described above.

First, a base is provided for accommodating a device that includes a transmitter diode or receiver diode for transmitting data.

In particular, the base may be a punched metal part.

The device comprising the receiver or transmitter diode is connected to the connection leads by means of bonding wires.

The connection leads are passed through a passage through the base and sealed in the base by a sealing compound, in particular a glass sealing compound.

According to the invention, in order to reduce the length of the bonding wires, at least one connection lead is formed with an enlarged cross section on the side of the device as compared to the cross section within the passage, or is arranged asymmetrically in the passage, or the connection lead is formed with an angle.

Further, the device may at least partially protrude into the area of the passage.

For at least partially compensating for an increase in capacity in some portions, at least one connection lead is arranged so as to protrude beyond the passage filled with sealing compound.

DESCRIPTION OF THE DRAWINGS

FIG. 17 is a perspective view of another embodiment of a TO housing.
FIG. 18 is a plan view of the TO housing of FIG. 17.
FIG. 19 is a sectional view of the TO housing taken along line A-A in FIG. 18.
FIG. 20 is a perspective view of another embodiment of a TO housing.
FIG. 21 is a plan view of the TO housing of FIG. 20.
FIG. 22 is a sectional view of the TO housing taken along line A-A in FIG. 21.
FIG. 23 is a perspective view of another embodiment of a TO housing.
FIG. 24 is a plan view of the TO housing of FIG. 23.
FIG. 25 is a sectional view of the TO housing taken along line A-A in FIG. 24.

DETAILED DESCRIPTION

Figure 1:
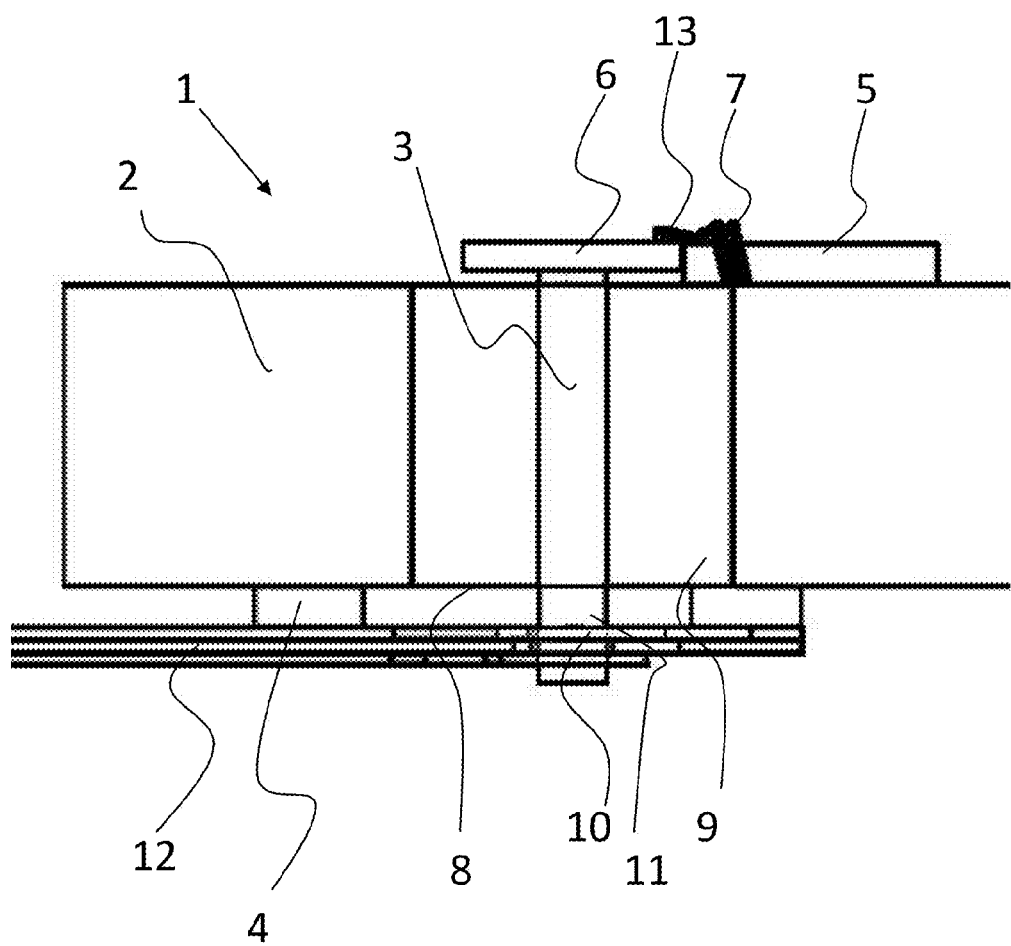
FIG. 1 is a sectional view of a TO housing.

The subject matter of the invention will now be described in more detail with reference to exemplary embodiments schematically illustrated in the drawings of FIGS. 1 through 35.

FIG. 1 schematically shows a sectional view of a TO housing 1. TO housing 1 comprises a base 2 made of metal, which is partially shown in this view.

Base 2 serves to receive a device 5 which is configured as a chip and comprises a transmitter diode and/or receiver diode (not shown).

Device 5 comprises contacts for connecting the signal leads and is connected to the signal leads 3 and to the base for the return path by means of bonding wires 7.

As can be seen in the sectional view, signal lead 3 passes through a passage 8 through base 2. For this purpose, signal lead 3 is embedded in a sealing compound 9 of glass.

At the upper side of the TO housing, signal lead 3 is formed as a kind of plate 6, or with a mushroom-like shape, hence the cross section of signal lead 3 is enlarged at the upper side.

Therefore, the contact points 13 for the point connection of bonding wires 7 are closer to device 5. Consequently, the length of bonding wires 7 may be significantly reduced.

At the bottom side, connection lead 3 is connected to a circuit board 12 which is configured as a multilayer circuit board.

Other leads 4 that can also be seen at the bottom side are used for power supply to device 5.

Usually, a generic TO housing further includes several return paths and grounding paths which are formed through the base.

Above electrical connection 10 there is an excess length 11 which produces an additional inductance of connection lead 3.

This additional inductance at least partially compensates for the additional capacity produced by plate 6, so that the TO housing of the invention allows for a sufficient transmission performance even in a frequency range well above 10 GHz.

The amount of the additional inductance can be adjusted through the amount of excess length 11 by which the circuit board 12 is spaced from base 2. Due to the air gap between circuit board 12 and base 2, excess length 11 produces an additional inductance.

Figures 2, 3:
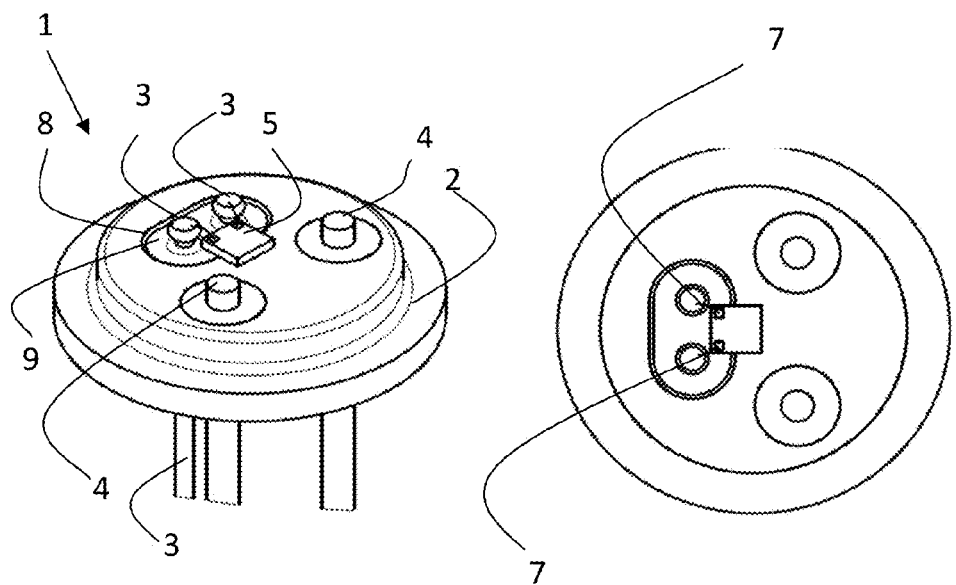
FIG. 2 is a perspective view of a TO housing.
FIG. 3 is a plan view of the TO housing of FIG. 2.

FIG. 2 shows a schematic perspective view of a TO housing 1 which is equipped with a device 5 in form of a chip.

In this exemplary embodiment, device 5 partially projects into the area of passage 8 which is filled with a sealing compound 9. In addition, connection leads 3 are formed with a mushroom head shape on the upper ends thereof.

As can be seen in the plan view of FIG. 3, by virtue of these measures the length of bonding wires 7 is very short.

Figures 4, 5:
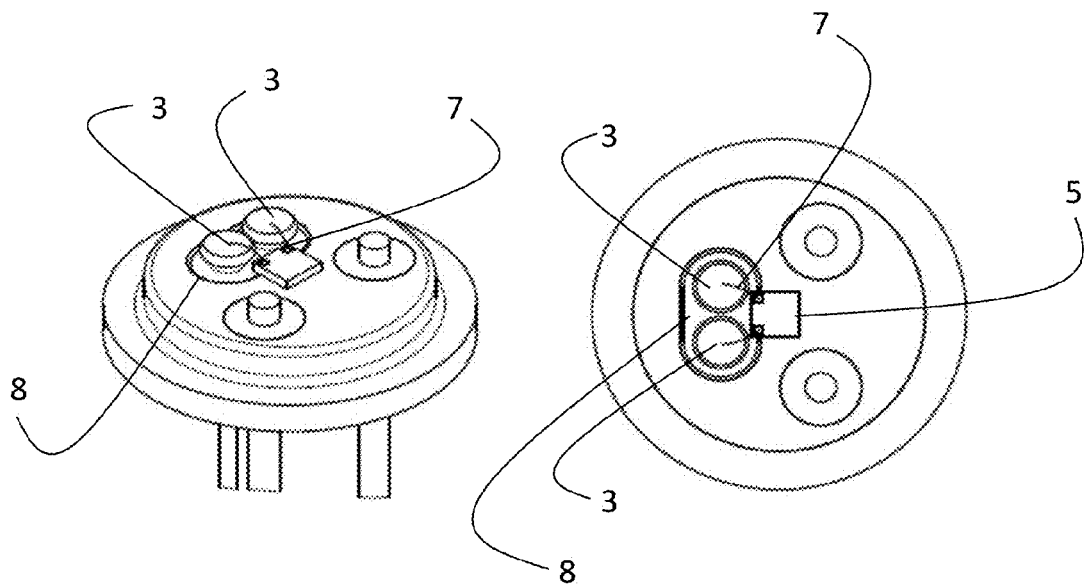
FIG. 4 is a perspective view of another embodiment of a TO housing.
FIG. 5 is a plan view of the TO housing of FIG. 4.

FIGS. 4 and 5 show a further embodiment of the invention, in which the mushroomhead-shaped portion of connection leads 3 has a significantly greater diameter as compared to the embodiment illustrated in FIGS. 2 and 3, and almost extends until the edge of passage 8.

Device 5 may therefore be disposed closer towards the center of base 2, with approximately the same short length of bonding wires 7, so that it projects less into the area of passage 8, resulting in an improved heat dissipation from the chip through the base.

Figures 6, 7:
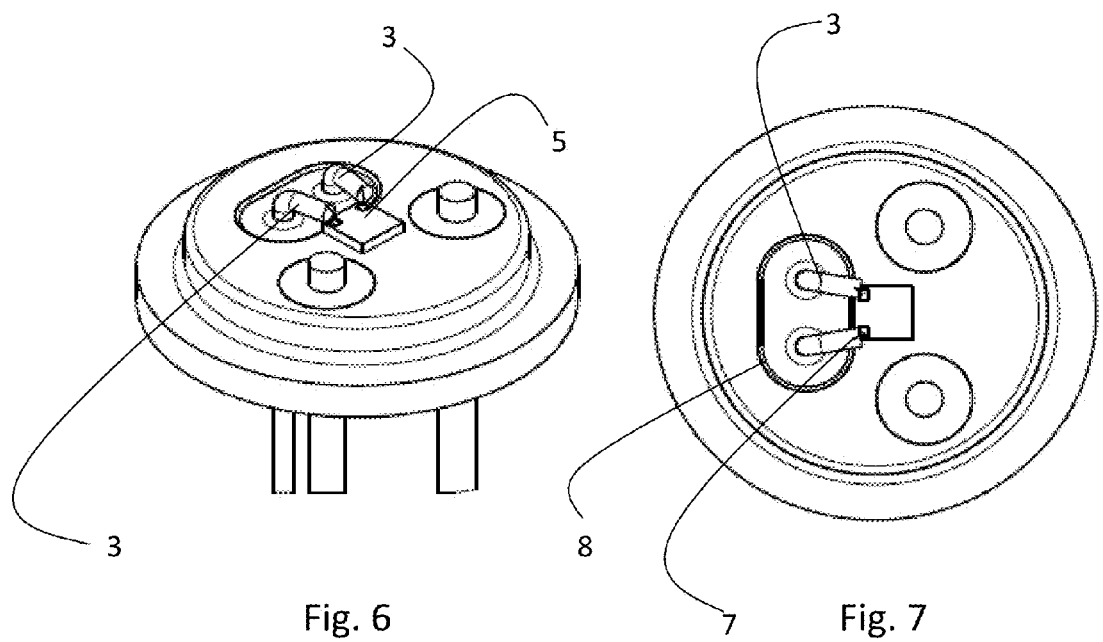
FIG. 6 is a perspective view of another embodiment of a TO housing.
FIG. 7 is a plan view of the TO housing of FIG. 6.
Figure 8:
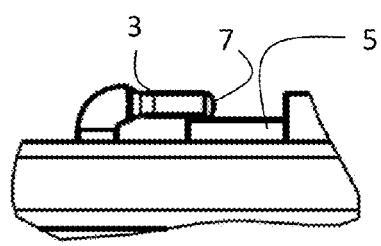
FIG. 8 is a detailed side view of the TO housing of FIG. 6.

Referring to FIGS. 6 to 8, a further embodiment of the invention will be explained.

In this embodiment, connection leads 3 are angled at the upper surface pointing towards device 5.

For better heat dissipation, device 5 is disposed completely outside passage 8.

In the detailed view of FIG. 8 it can be seen that connection lead 3 extends until device 5, so that the bonding wire only serves to establish contacts, but does not have to span a distance any more.

Figures 9, 10:
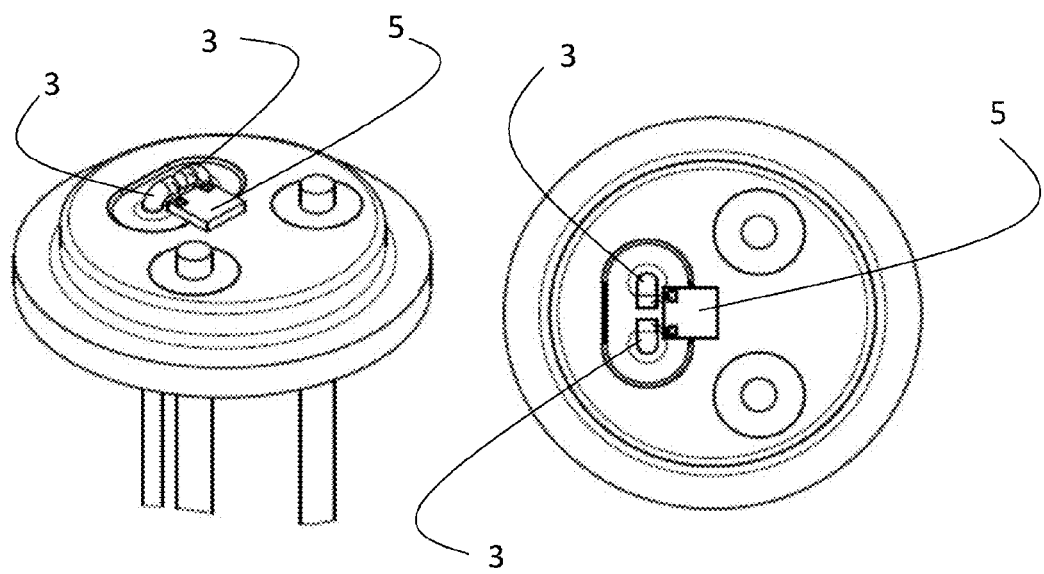
FIG. 9 is a perspective view of another embodiment of a TO housing.
FIG. 10 is a plan view of the TO housing of FIG. 9.
Figure 11:
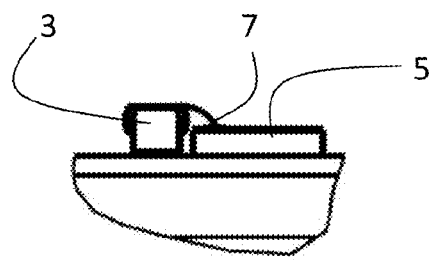
FIG. 11 is a detailed side view of the TO housing of FIG. 9.

FIGS. 9 to 11 show another embodiment of the invention.

Here, connection leads 3 are also angled.

However, the angled portions of connection leads 3 face each other.

Device 5 projects into the area of passage 8.

As can be seen in the detailed view of FIG. 11, this exemplary embodiment likewise leads to a short bonding wire 7.

It is of advantage here that the angled portions of connection leads 3 can be bonded from the lateral side.

Figures 12, 13:
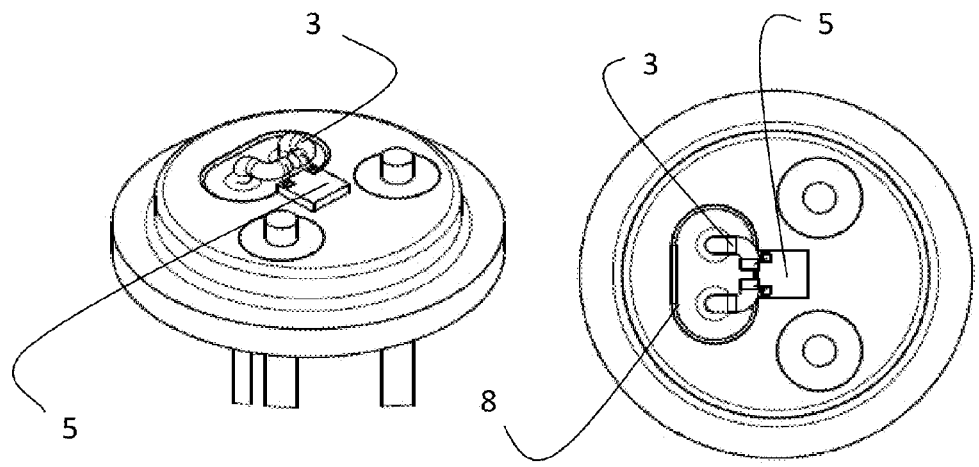
FIG. 12 is a perspective view of another embodiment of a TO housing.
FIG. 13 is a plan view of the TO housing of FIG. 12.

FIGS. 12 and 13 show another exemplary embodiment of the invention in which the connection leads 3 are angled twice so as to first extend toward device 5 and then, due to a further angle, face each other.

In this manner, connection leads 3 can be bonded from the lateral side while bridging passage 8.

Figures 14, 15:
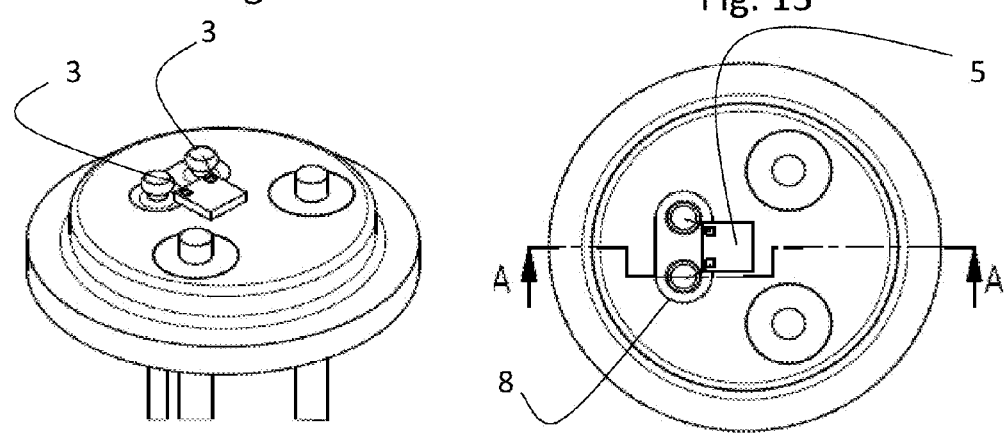
FIG. 14 is a perspective view of another embodiment of a TO housing.
FIG. 15 is a plan view of the TO housing of FIG. 14.
Figure 16:
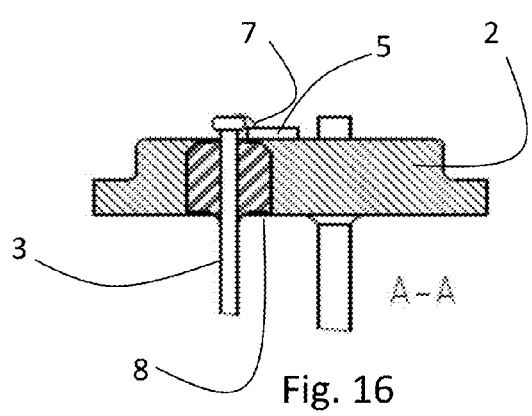
FIG. 16 is a sectional view of the TO housing taken along line A-A in FIG. 15.

FIGS. 14 to 16 show another embodiment of the invention.

FIG. 14 shows a perspective view. What can be seen herein are the connection leads 3 which have a mushroom head shape at their ends in this embodiment.

FIG. 15 shows a plan view. In particular device 5 can be seen, which partially projects into the area of passage 8.

FIG. 16 shows a sectional view taken along line A-A of FIG. 15.

As can be seen, passage 8 filled with sealing compound 9 tapers at the upper end thereof.

Therefore, base 2 is projecting in this region, so that device 5 may be disposed closer toward connection lead 3 without being seated on sealing compound 9.

Also, the length of bonding wire 7 is particularly short.

Referring to FIGS. 17 to 19, a further embodiment of the invention will be explained.

FIG. 17 shows a perspective view and FIG. 18 shows a plan view of a TO housing.

It can be seen, that connection leads 3 have a mushroom head shape, and that the device which includes at least a transmitter diode or receiver diode protrudes into the area of passage 8.

As can be seen in FIG. 19 which is a sectional view taken along line A-A of FIG. 18, the passage is closed on its upper end by a plate 14 through which only the connection lead 3 extends. The sealing compound 9 is arranged below plate 14, and plate 14 serves as a support for device 5.

FIGS. 20 to 22 show another exemplary embodiment of the invention.

As can be seen in the perspective view of FIG. 20 and in the plan view of FIG. 21, two passages are provided through which a respective connection lead extends, and the diameter of the passage in this view is very small, so that device 5 may be disposed close to connection leads 3.

As can be seen in the sectional view of FIG. 22 which is taken along line A-A of FIG. 21, this embodiment is obtained by providing a step in the base in the area of passage 8.

That is, the two passages 8 shown in FIG. 20 and FIG. 21 merge into one passage 8 filled with sealing compound 9 below the step.

Due to the step, device 5 may be simply placed directly adjacent to connection lead 3.

FIGS. 23 to 25 show another embodiment of the invention.

As will be apparent from FIGS. 23 and 24, two passages 8 can be seen at the upper side, similar to FIGS. 20 and 21.

As can be seen in FIG. 25 which is a sectional view taken along line A-A of FIG. 24, unlike in the embodiment of FIGS. 20 to 22, an intermediate plate 15 is disposed on base 2 in this embodiment, which has two small apertures for passing connection leads 3.

Device 5 is seated on this intermediate plate 15 directly adjacent to connection lead 3.

Below intermediate plate 15 the passage is filled with sealing compound 9.

Figures 26, 27:
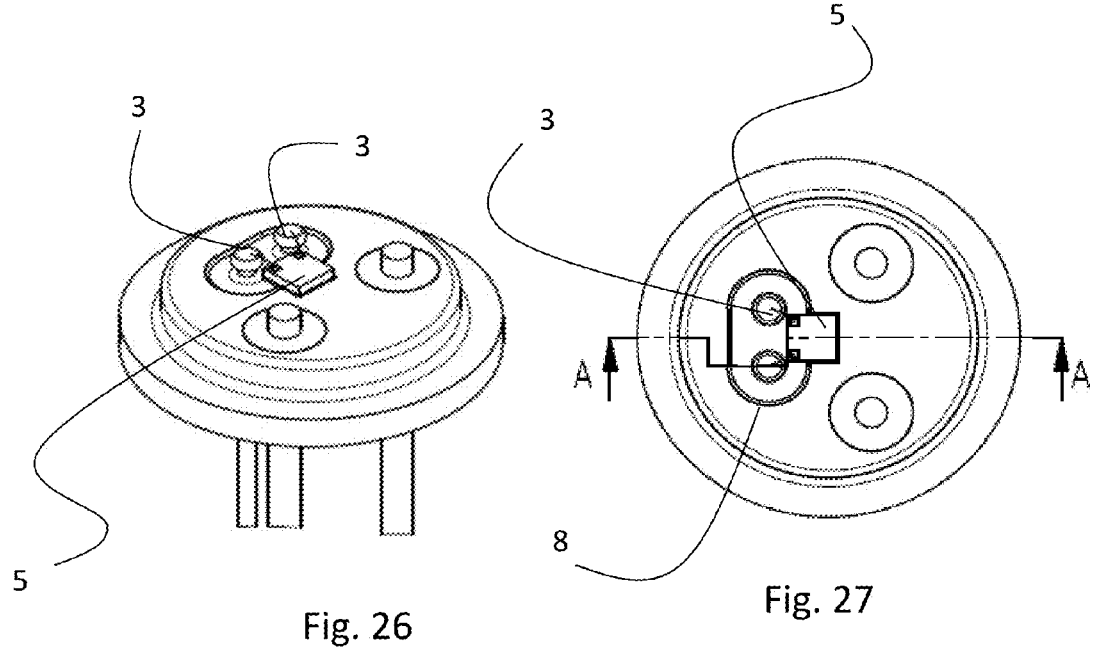
FIG. 26 is a perspective view of another embodiment of a TO housing.
FIG. 27 is a plan view of the TO housing of FIG. 26.
Figure 28:
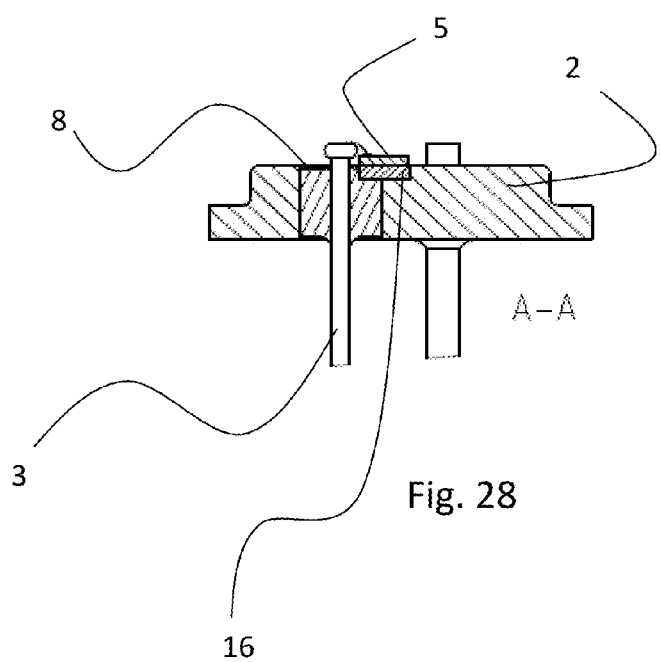
FIG. 28 is a sectional view of the TO housing taken along line A-A in FIG. 27.

The drawings of FIGS. 26 to 28 show another exemplary embodiment of the invention.

In the views of FIGS. 26 and 27 it can be seen that device 5 protrudes into the area of passage 8.

In the sectional view of FIG. 28 taken along line A-A of FIG. 27 it can be seen that base 2 is provided with a support plate 16 which is arranged next to connection lead 3 and which partly protrudes into the area of the passage and partly extends into base 2. Device 5 is placed on the support plate directly adjacent to connection lead 3.

Figures 29, 30:
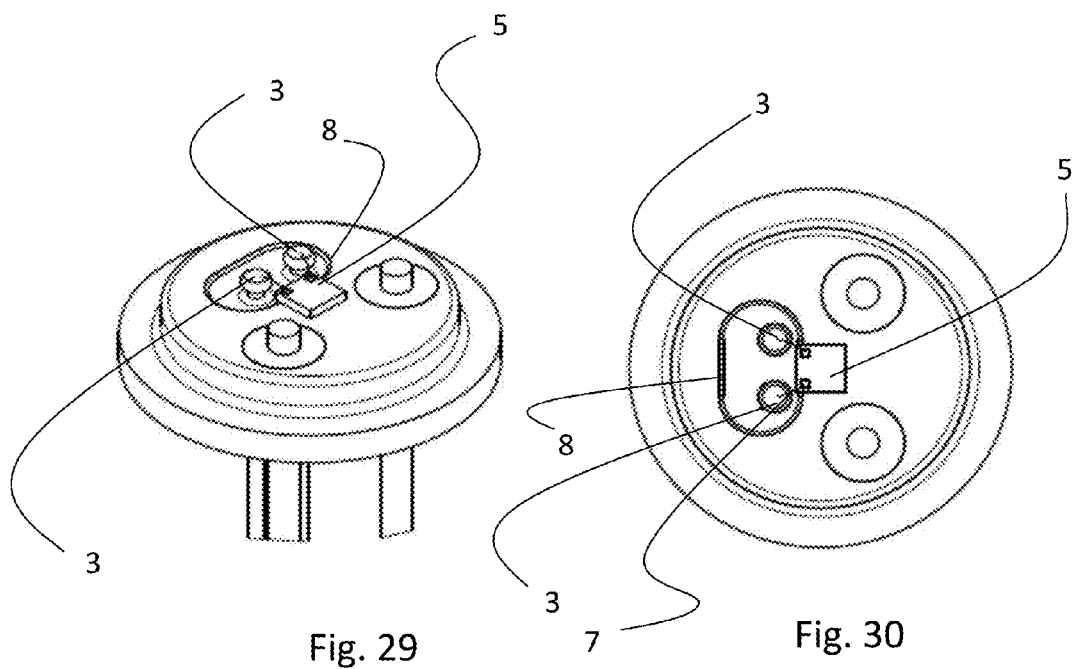
FIG. 29 is a perspective view of another embodiment of a TO housing.
FIG. 30 is a plan view of the TO housing of FIG. 29.

FIGS. 29 and 30 shows another exemplary embodiment of the invention.

In this exemplary embodiment, connection leads 3 which may have a mushroom-shaped end are arranged asymmetrically and offset toward device 5.

This is a further possibility to reduce the length of bonding wires 7.

Especially this embodiment may be combined with the exemplary embodiments described above.

Figure 31:
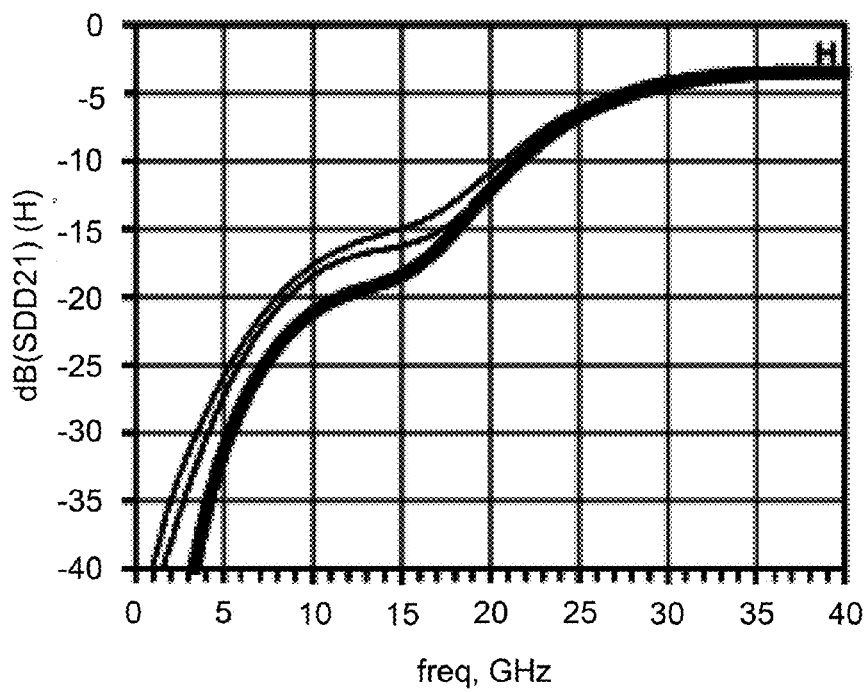
FIG. 31 is a graph illustrating the return loss (dB) of a TO housing according to the invention plotted against frequency (GHz).

In the coordinate system illustrated in FIG. 31, the return loss of an equipped TO housing according to the invention is plotted against frequency.

The x-axis represents the frequency in GHz, and the y-axis represents the return loss in dB.

It can be seen that in a frequency range between 20 and 30 GHz, the return loss is less than −15 dB.

Figure 32:
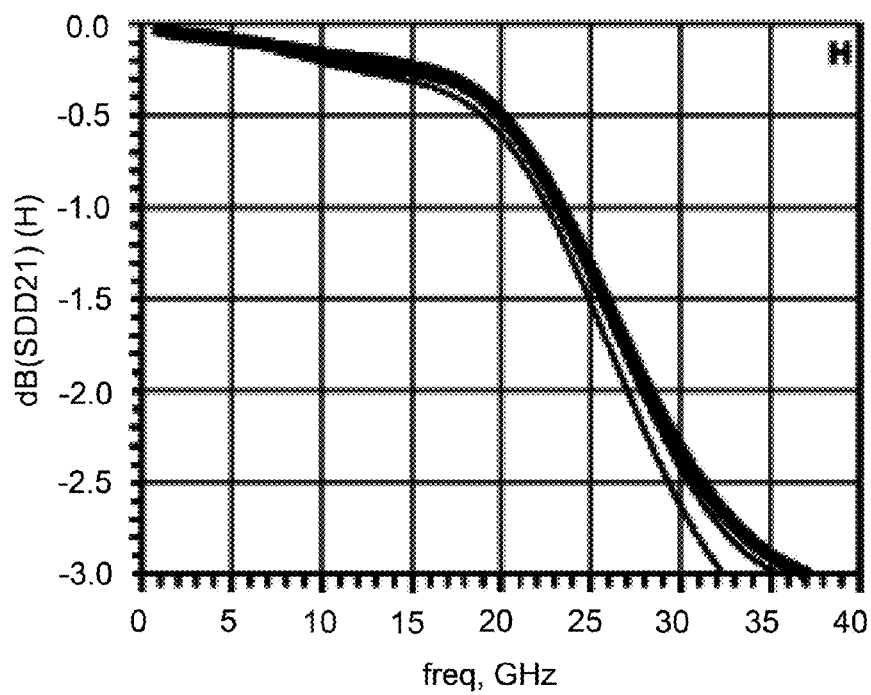
FIG. 32 is a graph illustrating the insertion loss (dB) plotted against frequency (GHz).

FIG. 32 shows the insertion loss, again with the frequency in GHz represented on the x-axis, and with the insertion loss in dB represented on the y-axis. Up to 25 GHz, insertion loss is less than −1.5 dB.

Figure 33:
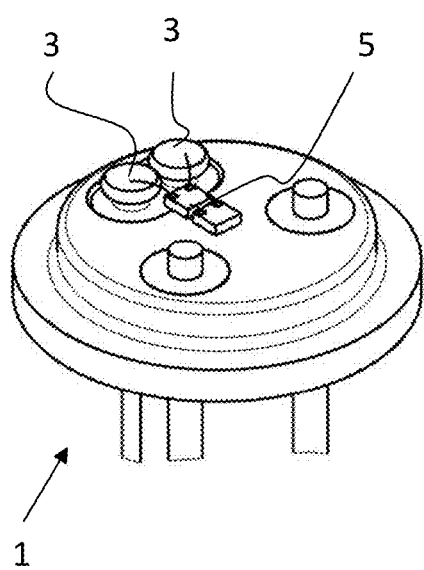
FIG. 33 is a perspective view of another embodiment of a TO housing.
Figure 34:
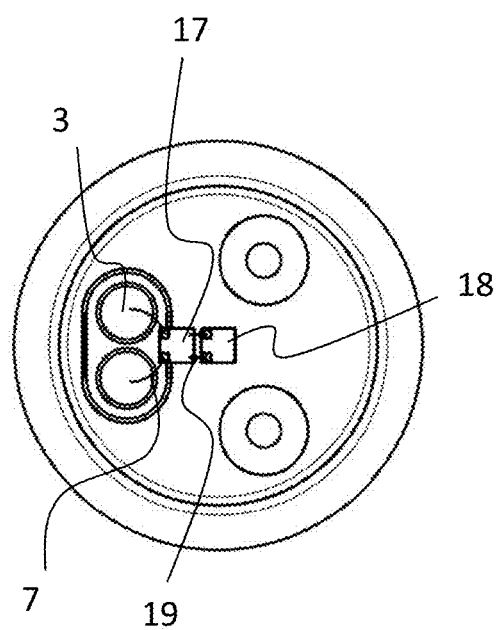
FIG. 34 is a plan view of the TO housing of FIG. 33.

FIG. 33 and FIG. 34 show a fully equipped TO housing.

As can be seen in FIG. 33, the TO housing 1 comprises a device 5 including the transmitter diode or receiver diode and consisting of two chips which are mounted on base 2 and connected to connection leads 3 by bonding wires 7.

As seen especially clearly in FIG. 34, the device in this embodiment comprises a photodiode 18 which is seated on a chip, and an amplifier unit 17 which is connected to connection leads 3 by means of bonding wires 7. Amplifier unit 17 and photodiode 18 are interconnected by further bonding wires 19.

In the sense of the invention, the device including a transmitter diode or receiver diode may consist of several interconnected devices, in particular chips.

Figure 35:
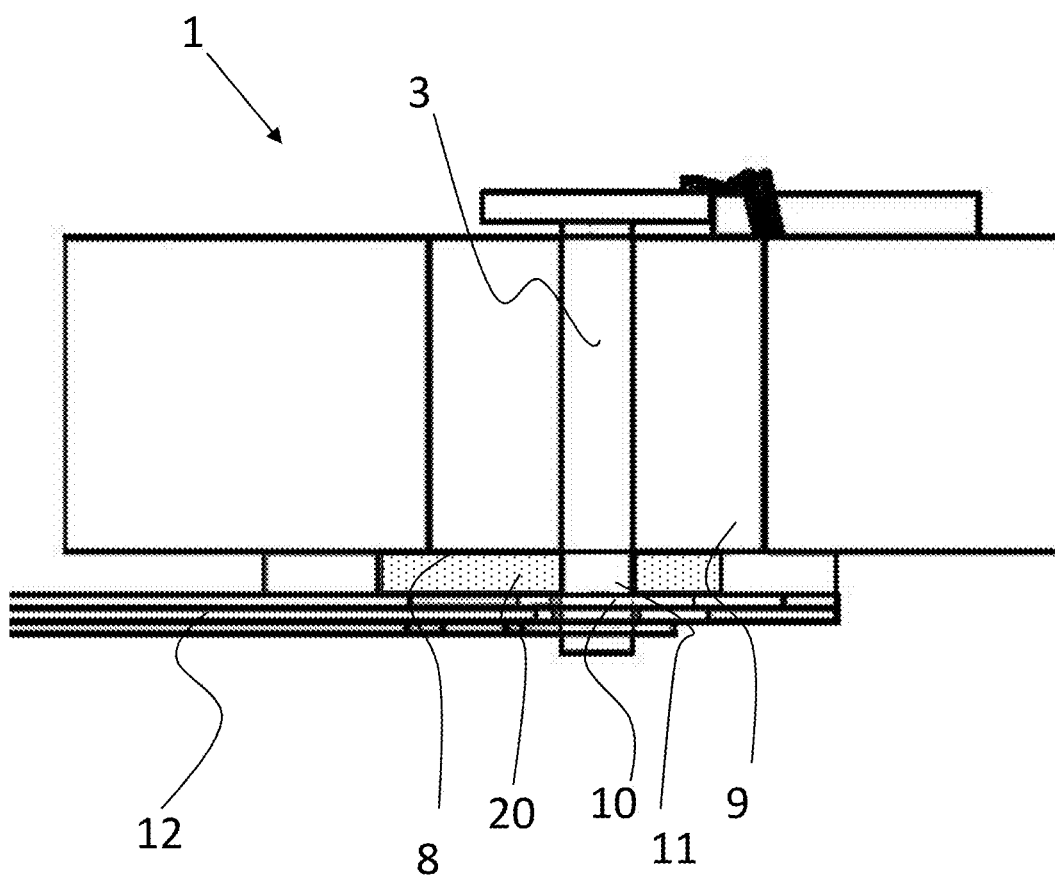
FIG. 35 is a sectional view of a TO housing.

Referring to FIG. 35, another embodiment of the invention will be explained, in which the excess length 11 is not surrounded by air.

In this exemplary embodiment, a material 20 having a lower dielectric constant than the sealing compound 9 is arranged in the area of excess length 11.

This likewise produces an inductance which compensates for the capacitance of passage 8.

It will be understood that depending on the dielectric constant of the material 20, the excess length 11 will be dimensioned differently, in particular slightly longer.

Material 20 may either be a sealing material which is spray-deposited, or a plate which is glued to circuit board 12 or to TO housing 1, for example, or which is only loosely interposed.

Material 20 may at the same time serve as a spacer which ensures the correct position of electrical connection 10 of connection lead 3.

Further, material 20 may occupy a portion of the bottom of TO housing 1 or the entire bottom of the TO housing.

Otherwise, the illustrated embodiment corresponds to the embodiment shown in FIG. 1.

It will be understood, however, that the filling of the gap between TO housing and circuit board with a material of a low dielectric constant as described above may be effected in all embodiments described in the present application.

The invention allows for a simple design of a TO base that may be used for high bandwidths. Such an equipped TO base may be used in particular for fiber optic Ethernet or Fibre Channel networks.

LIST OF REFERENCE NUMERALS

1 TO housing
2 Base
3 Connection lead
4 Other lead
5 Devices
6 Plate
7 Bonding wire
8 Passage
9 Sealing compound
10 Electrical connection
11 Excess length
12 Flexible circuit board
13 Contact point
14 Plate
15 Intermediate plate
16 Support plate
17 Amplifier unit
18 Photodiode
19 Bonding wire
20 Material of low dielectric constant

What is claimed is:

1. A transistor outline housing, comprising:
a device including a receiver diode or a transmitter diode;
a base that receives the device; and
bonding wires connecting the device to at least one connection lead, the connection lead passing through a passage in the base, being insulated from the base, and being secured in the base by a sealing compound;
wherein the housing has a configuration to reduce a length of the bonding wires, the configuration being selected from the group consisting of: providing the connection lead with an enlarged cross section at a side of the device as compared to a cross section in the passage, providing the connection lead with an asymmetric arrangement in the passage, angling the connection lead, and protruding the device into an area of the passage; and
wherein, in order to at least partially compensate for an increase in capacity resulting thereby, the connection lead has an excess length beyond the passage at a side of an electrical connection;
wherein the bonding wires have an inductance $L_b$ and the connection lead in the passage has a capacitance $C_d$; and
wherein the connection lead beyond the passage has an excess length that has associated therewith an inductance $L_ü$, so that an $L_b$-$C_d$-$L_ü$ circuit is defined, and wherein the $L_b$-$C_d$-$L_ü$ circuit has an impedance in the range of between 30 and 120Ω, with $L_b$ between 80 pH and 300 pH, $C_d$ between 0.065 pF and 0.024 pF, and $L_ü$ between 80 pH and 300 pH.

2. The housing as in claim 1, wherein the device further comprises the impedance is in the high frequency range of between 40 and 60Ω.

3. The housing as in claim 1, wherein the bonding wires have a length of less than 1 mm.

4. The housing as in claim 1, further comprising a circuit board to which the connection lead is connected, the circuit board being spaced from the base by an air gap, and wherein, in the region of the excess length, the connection lead is arranged in the air gap between the circuit board and the base.

5. The housing as in claim 4, wherein the sealing compound is a glass sealing compound, and wherein the device is a chip.

6. The housing as in claim 1, wherein the electrical connection is connected to a flexible circuit board.

7. The housing as in claim 1, wherein the connection has an excess length of 0.1 to 3 mm.

8. The housing as in claim 1, wherein the housing has a height between 0.5 mm and 2 mm.

9. The housing as in claim 1, wherein the cross section of the passage tapers toward the side of the transmitter diode or receiver diode.

10. The housing as in claim 9, wherein the cross section of the passage tapers in a conical or a stepped manner.

11. The housing as in claim 1, wherein the housing is configured to transmit data at a data rate of more than 20 Gbit/s.

* * * * *